(12) United States Patent
Hicks et al.

(10) Patent No.: US 10,770,505 B2
(45) Date of Patent: Sep. 8, 2020

(54) PER-PIXEL PERFORMANCE IMPROVEMENT FOR COMBINED VISIBLE AND ULTRAVIOLET IMAGE SENSOR ARRAYS

(71) Applicant: Intel Corporation, Santa Clara, CA (US)

(72) Inventors: Richmond Hicks, Beaverton, OR (US); Khaled Ahmed, Anaheim, CA (US)

(73) Assignee: Intel Corporation, Santa Clara, CA (US)

( * ) Notice: Subject to any disclaimer, the term of this patent is extended or adjusted under 35 U.S.C. 154(b) by 140 days.

(21) Appl. No.: 15/479,722

(22) Filed: Apr. 5, 2017

(65) Prior Publication Data

US 2018/0295295 A1    Oct. 11, 2018

(51) Int. Cl.
*H01L 27/14* (2006.01)
*H01L 27/146* (2006.01)

(52) U.S. Cl.
CPC .... *H01L 27/14649* (2013.01); *H01L 27/1464* (2013.01); *H01L 27/14605* (2013.01); *H01L 27/14621* (2013.01); *H01L 27/14636* (2013.01); *H01L 27/14645* (2013.01); *H01L 27/14685* (2013.01); *H01L 27/14689* (2013.01)

(58) Field of Classification Search
IPC ............... H01L 27/14649,27/14621, 27/14689, 27/14636, 27/1464, 27/14685, 27/14605, 25/167, 27/3227, 31/02024, 31/0284, 31/1032, 31/107

See application file for complete search history.

(56) References Cited

U.S. PATENT DOCUMENTS

| | | | | |
|---|---|---|---|---|
| 6,133,615 A | * | 10/2000 | Guckel | H01L 27/14601 257/292 |
| 2008/0142856 A1 | * | 6/2008 | Sato | H01L 27/14609 257/292 |
| 2010/0032569 A1 | * | 2/2010 | Kita | G01J 1/4228 250/338.4 |
| 2011/0042556 A1 | * | 2/2011 | Natsuaki | G01J 1/44 250/226 |
| 2013/0015435 A1 | * | 1/2013 | Sawaki | B82Y 10/00 257/40 |
| 2013/0075607 A1 | * | 3/2013 | Bikumandla | H01L 27/14632 250/332 |
| 2014/0166980 A1 | * | 6/2014 | Goda | H01L 33/06 257/13 |

(Continued)

OTHER PUBLICATIONS

Aubin, J. et al., "Epitaxial growth of Si and SiGe at temperatures lower than 500° C. with disilane and germane", Thin Solid Films; vol. 602; Mar. 1, 2016, pp. 36-42.

(Continued)

*Primary Examiner* — Moin M Rahman
(74) *Attorney, Agent, or Firm* — Green, Howard & Mughal LLP.

(57) ABSTRACT

Per-pixel performance is improved in a combined visible and ultraviolet image sensor array such as for a hyperspectral camera. In one example, an array of photodetectors is formed on a silicon substrate. A subset of the photodetectors are improved to improve sensitivity to ultraviolet light, and the photodetector array is finished to form an image sensor.

25 Claims, 5 Drawing Sheets

(56) References Cited

U.S. PATENT DOCUMENTS

2014/0373919 A1* 12/2014 Desrues .......... H01L 31/022441
136/258
2015/0311242 A1* 10/2015 Bai .................. H01L 27/14647
348/164
2017/0294474 A1* 10/2017 Uchihashi ................ G01J 1/42

OTHER PUBLICATIONS

Warren, et al., "Growth of antiphase-domain-free GaP on Si substrates by metalorganic chemical vapor deposition using an in situ AsH3 surface preparation", Applied Physics Letters, vol. 107, 082109 (2015), 5 pages.

* cited by examiner

PER-PIXEL PERFORMANCE IMPROVEMENT FOR COMBINED VISIBLE AND ULTRAVIOLET IMAGE SENSOR ARRAYS

FIELD

The present description relates to the field of image sensors for ultraviolet light and, in particular, to an image sensor with pixels that are configured for particular optical bands.

BACKGROUND

Small image sensors continue to improve in cost and performance and have become ubiquitous in smart phones, notebook computers, tablets and many other devices. At the same time new device types such as headsets, glasses, dashboard cameras, and autonomous vehicles continue to emerge. The common CMOS (Complementary Metal Oxide Semiconductor) image sensor that is used in most digital cameras has an array of photodetectors. Usually there is one photodetector for each pixel. The sensor is well suited to capture and measure visible light.

The same image sensor is also able to capture and measure ultraviolet and NIR (Near Infrared) light. As a result, new applications are being developed to exploit these properties. Imaging applications extending the range of spectral sensitivity beyond the visible range are coming to market. In addition to applications extending sensitivity to the NIR spectrum, hyperspectral cameras and multi-spectral cameras are coming to market that extend the sensitivity into the UV spectrum for applications ranging from chemical composition analysis, to detecting fruit ripeness, to detecting the correct application of sunscreen.

Hyperspectral image sensors have been developed using a common underlying photodetector element that is often optimized for the visible spectrum due to the large focus on visible photography.

Imaging applications extending the range of spectral sensitivity beyond the visible range are coming to market. These applications include face recognition, iris scanning, and multi-spectral imaging for analyzing chemical content to name a few examples.

BRIEF DESCRIPTION OF THE DRAWING FIGURES

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity.

DETAILED DESCRIPTION

A camera is implemented herein with a subset of its pixels optimized for UV light sensitivity and especially for near UV (NUV). A sensor for such a camera may be fabricated by selective epitaxial growth of δ-doped Si in a UV sub-pixel to enhance the detection of UV light in that subpixel. In some examples, the Si is applied using MOCVD (Metal Organic Chemical Vapor Deposition) over silicon nitride mask. The hard mask masks off all but the UV subpixels. This is able to yield Red subpixels, Green subpixels, Blue subpixels, NIR subpixels and UV sub pixels, each with an optimized QE (Quantum Efficiency) for the salient wavelengths.

As described herein the charge collection region of an image sensor is optimized on a per pixel basis. The Quantum Efficiency (QE) and detector leakage are improved based on the wavelength being detected at each pixel. This allows visible or ultraviolet light performance to be enhanced on a single sensor of an array or on the entire image array. Such sensors are useful not only for biometric identification but also for lighting control and materials scanning, such as checking food.

CMOS image sensors provide good performance for visible light and also for infrared light. They have a common underlying photodetector element that is optimized for the visible spectrum due to the large focus in the marketplace on visible light photography. This leads to a lower performance in the near infrared (NIR) wavelengths and much lower performance in the ultraviolet wavelengths both of which are considered less important in the marketplace. As described herein, each pixel may be configured to provide high performance for its intended purpose without affecting the other pixels.

The most common material used to build photodetectors for imaging applications is silicon. The spectral absorption of silicon at longer wavelengths is reduced due to the band-gap of silicon which is about 1.14 eV. As photons approach this energy level, the probability of absorption for a given penetration depth decreases and for photons below this energy level, silicon is transparent. Photons travel right through the silicon and energy cannot be absorbed and detected.

Figure 1:
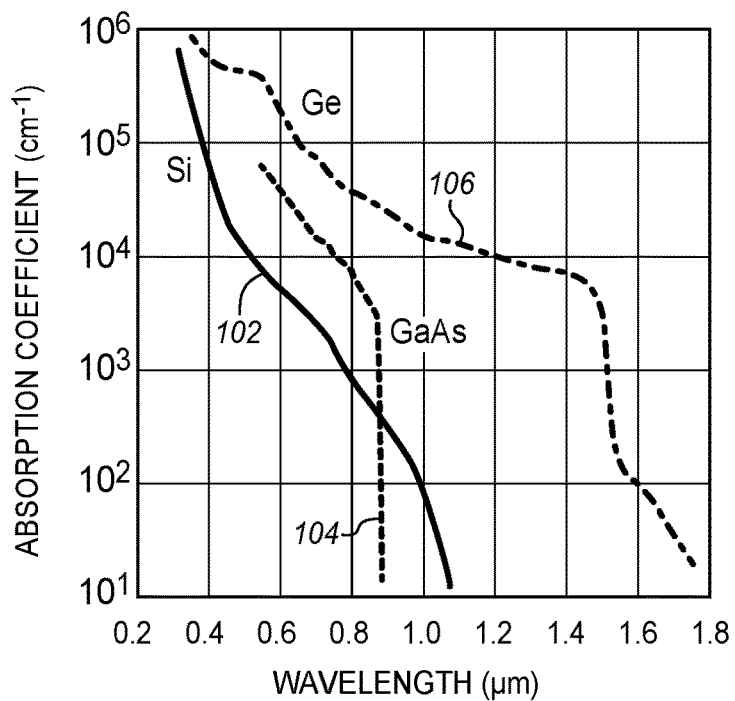
FIG. 1 is a graph of photon absorption of various materials.

Other materials are used for optical applications and may be used for image sensors such as germanium and gallium arsenide. FIG. 1 is a graph of the absorption coefficient on the vertical axis for different light wavelengths on the horizontal axis for three materials. The curve 102 for silicon shows a very steep drop in absorption as the wavelength increases. At short near UV wavelengths less than 0.4 µm there is very high absorption. At 0.3 µm, the absorption is too high. At the other end at about a 1.1 µm wavelength there is almost no absorption. A curve 104 for GaAs shows almost no UV absorption but a much higher absorption coefficient up to about 0.85 µm in the wavelength of incident light. For longer wavelengths there is almost no absorption. A curve 106 for germanium has higher absorption at wavelengths in the UV range about 0.4 µm and also at wavelengths longer than and up to 1.5 µm after which the absorption drops almost immediately.

The absorption of shorter wavelength light is quite high for silicon, germanium and gallium arsenide and for Near Ultra-Violet (NUV) wavelengths the absorption is too high. The high absorption means that the photons are absorbed at a very shallow depth and do not penetrate into the photo-diode area, and therefore do not contribute to the collected charge. This problem is endemic in all of the available materials used for the creation of photodiodes. A new solution is described herein.

Figure 2:
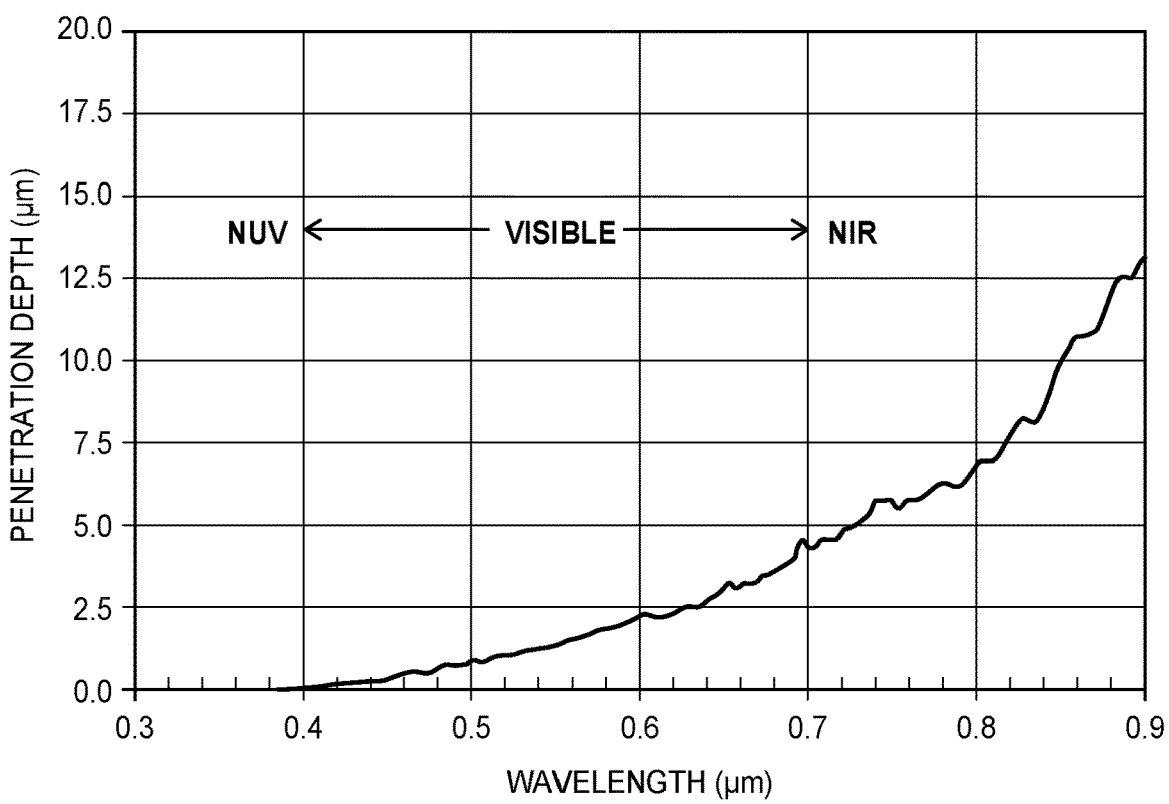
FIG. 2 is a diagram of photodetector penetration depth at various wavelengths.

FIG. 2 is a diagram of penetration depth in a silicon photodiode as a function of wavelength. As shown in the near UV below 0.4 µm, there is almost not penetration. Photons are absorbed at such a shallow depth that the charge is lost due to recombination before the charge can be collected. The penetration depth increases with longer wavelengths. On the right side in the near IR the penetration eventually becomes so deep that the photons are travel past the collector and do not register or create noise in some other part of the sensor array.

Figure 3:
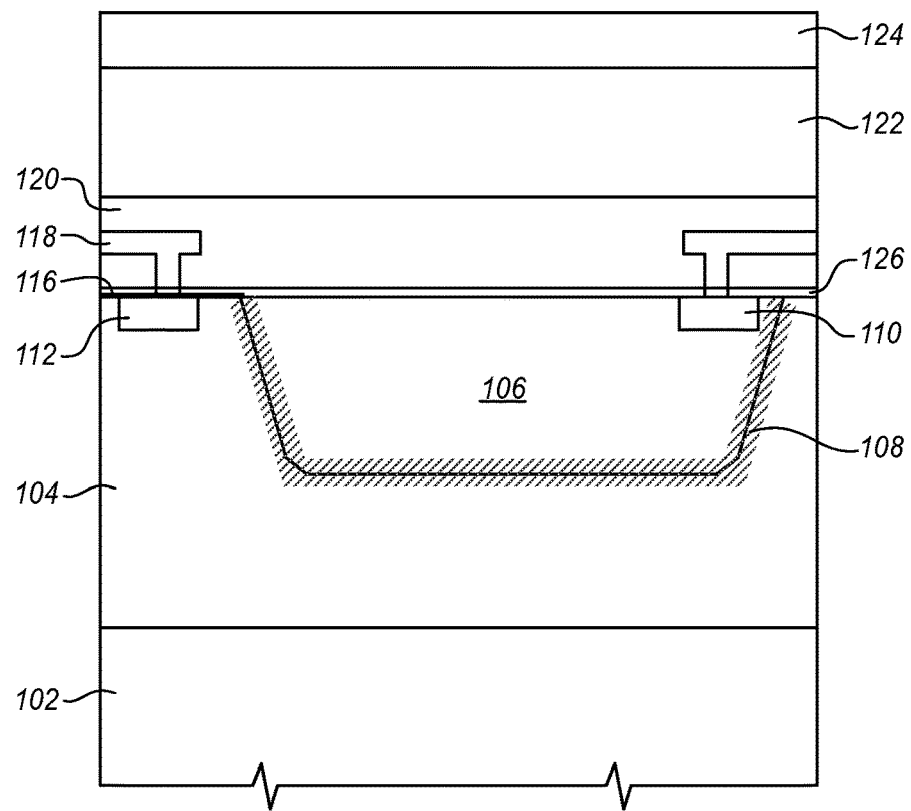
FIG. 3 is a diagram of a photodetector having thin layer for UV enhancement according to an embodiment.

FIG. 3 is a cross-sectional side view diagram of a FSI (Front Side Illuminated) pixel of a Si CMOS (Complementary Metal Oxide Semiconductor) image sensor. While a BSI (Back Side Illuminated) CMOS sensor or a CCD (Charge Coupled Device) sensor has some differences, the same general operation shown in this diagram applies. In any case the penetration depth as explained herein puts a limit on the collection of the pixel.

In this Si CMOS example, the pixel and the other pixels of the array are built upon a silicon substrate 102. A p-type epitaxial layer 104 is built over the substrate and an n-well 106 is formed in the p-type base. There is a depletion region 108 formed by the bottom and side of the n-well 106 between the n-type well and the p-type base. Contacts are formed in the epitaxial layer as shown. A p+ contact 112 is formed in the p-type portion and an n+ contact 110 is formed in the n-well. These contacts are coupled to front side metal routing 118 to connect to control and sensing circuitry. The n-well is covered by a silicide 116. A field oxide 120 is formed over the silicide and a further oxide 122 for the routing layers is formed over the field oxide. Typically a thin top layer 124 of natural oxide forms over the top of the pixel. Optical elements (not shown), such as filters, collectors, and lenses are typically placed over the top oxide layer.

In operation a photon is first absorbed by either the n-well 106 and of the epitaxial layer 104 and converted to an electron. The electron is then swept into the depletion region 108 where it can be collected as a charge that is read out from the contacts 110, 112 and converted to a signal. For much of the UV light, the wavelengths are so short, that the photons travel through the oxides but are immediately absorbed at the surface of the n-well and generate electrons that do not make it to the depletion layer. The electrons are lost due to recombination in the silicon before reaching the depletion layer and do not contribute to the signal.

Figure 5:
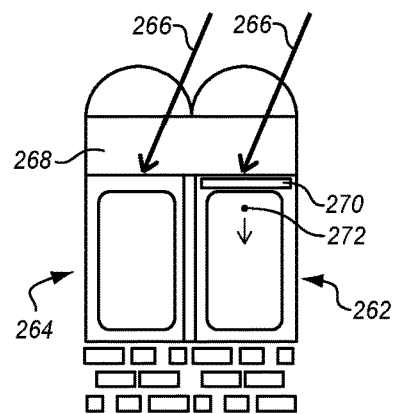
FIG. 5 is a diagram of comparative electron behavior for two photodetectors according to an embodiment.

As described herein, a thin (e.g. about 3 nm) layer may be added to the first surface of the NUV pixels. The added layer carries an electric charge and generates an electric field. The electric field accelerates the motion of the electrons near the surface of the pixel. These electrons are the ones generated by UV photons due to the short penetration depth for UV light wavelengths. The electrons are accelerated in the direction of the photo-diode's depletion region by the electric field. By accelerating the motion of the free electrons, the probability of their reaching the depletion region before being lost through recombination is improved. While the same charged layer may cause red and IR generated photons absorbed in the p-epi layer to be accelerated away from the depletion layer into the substrate, other longer wavelengths may be filtered out using color filters over the UV pixel. The difference in paths is shown in FIG. 5 as discussed below.

IR Pass, Red, green, blue and UV pass filters are laid on top of the silicon based photodiodes as in traditional multi-spectral imagers. In addition to the traditional dye or pigment-based color filters, plasmonic, thin film dielectric, metasurface, or equivalent filters may be used for more dense separation of light into more than the 5 basic colors mentioned.

Figure 4:
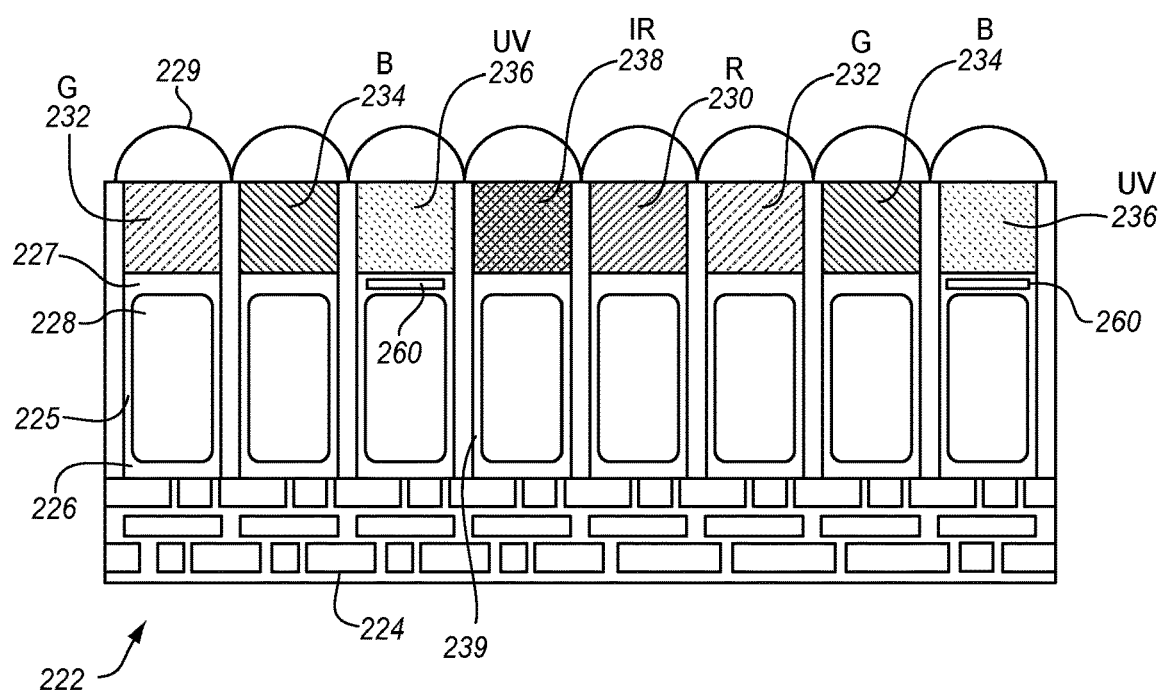
FIG. 4 is a cross-sectional side view diagram of a portion of an image sensor array with selective pixel enhancement according to an embodiment.

FIG. 4 is a cross-sectional side view diagram of a portion of a row of photodetectors of an image sensor array placed side-by-side. The pixel for each photodetector is part of a back-side illuminated array, however, embodiments are not so limited. The pixels are over a substrate 222 that includes wiring layers 224 for power, exposure control, and any other desired functions. Each pixel is formed in an n-well of a p-epi layer 225 that is over the wiring layer silicon substrate 222. The p-epi layer including the n-well is the layer that converts photons to electrons that may then be collected by the active photodiode. The sensor of this example includes a p+ surface passivation layer 227 over the photodiodes and a color filter 232, 234, 236, 238 and focusing lens 229 with an anti-reflective (AR) coating over the passivation layer.

Incident light strikes the AR coating and lens 229 and penetrates through the surface passivation 227 and the p-epi 225 to the n-well 228. The photons of the incident light are then converted to free electrons which can be measured in the circuitry of the wiring layers 222. The image sensor is made by flipping over the substrate after the circuitry is formed on the front side of the substrate. The photodetectors are over the backside of the silicon substrate 222. The wafer is flipped after all the circuitry is complete including the photodiodes, n-well, epi layer, etc. The backside is then ground to expose the epi-layer and the color filters are placed on the exposed epi-layer. A color filter 232, 234, 236, 238 is formed over each photodetector and additional optics, e.g. a condensing, collimating, or focusing lens 229 is formed over the color filter. As described below an implant 260 is added after the backgrinding and before adding the color filters.

In this example, deep trench isolation is used between the pixel regions. After the microlenses are formed, trenches are etched between the pixels and then filled with a dielectric material with a smaller index of refraction to form an optical and electrical barrier between the pixels.

In this example, the row has a repeating pattern of red 230, green 232, blue 234, UV 236, and infrared 238 color filters. This pattern repeats on each row. Such a pattern may be suitable for a hyperspectral camera. Typically the rows are offset but more complex patterns may alternatively be used. Instead of the even distribution of RGB, IR, and UV as shown, other patterns may be used or some of the colors may be excluded. One such pattern is a Bayer pattern with twice as many green color filters as red or blue. This pattern exploits the increased sensitivity to green in human perception. The resulting image often seems more detailed to a human eye than an image from an RGB array with the same number of pixels. Another example is to replace some of the green pixels of a Bayer pattern with UV pixels, ignoring the infrared. This provides enhanced UV capability without significantly degrading the imaging ability of the sensor. For machine vision, other colors may be selected that are important to the machine instead of human perception.

The color filters limit the light that is transmitted through the filter to the respective color. For the red filter, red light passes through the filter. Other light, such as green, blue, IR, and UV is reflected or absorbed by the filter. For red, green, and blue light, the standard absorption characteristics of silicon will serve well as photodetectors. One advantage of selectively modifying the UV response of the pixels is that UV light need not be removed from the non-UV pixels as they have relatively low response to these wavelengths. These photodetectors 228 are made in a conventional way and have a standard silicon bandgap.

The UV photodetector 236, that is the photodetector under the UV color filter, may be modified so that it responds better to UV light. This modification increases the leakage current of the photodiode, but is an acceptable trade-off when compared to the improved response for the UV pixel.

As shown in FIG. 4, red, green, blue, UV, and IR pass filters, 230, 232, 234, 236, 238 are laid on top of silicon based photodiodes 228 as in traditional multi-spectral imagers. The difference in this case is that the photodiodes 236 under the UV pass filters are augmented to increase the probability that a charge created by photons with a shallow penetration depth will reach the depletion region of the photodiode. Only the UV photodetectors are modified because the modification would increase the dark noise of the other photodetectors, and they do not need to be sensitive to UV.

The modification as described herein is to push the electrons formed in the UV pixel to the depletion layer. In some embodiments, this may be done with a thin layer 260 over the diffusion well. The layer may be formed in any of a variety of different ways. In one example, metal organic chemical vapor deposition (MOCVD) is used to cause the epitaxial growth of a δ-doped Si layer over the UV subpixel. The other pixels are masked to prevent the layer from being grown over the other pixels. A silicon nitride hard mask may be used to cover the other pixels. The hard mask is then removed and the color filters, and other optical components, are formed. This δ-doped silicon layer introduces a charge that in turn generates a field across the epitaxial layer that will increase the desired mobility of electrons in the direction of the P/N junction of the depletion zone.

FIG. 5 is a side cross-sectional view diagram of two adjacent pixels similar to the depiction of FIG. 4. One pixel 262 is treated with the UV enhancement and the other pixel 264 is not. UV photons 266 impinge on both of the pixels and strike the silicon. The UV photons have very shallow penetration so in the standard pixel 264 an electron is formed at the very upper surface of the silicon. This electron is very far from the depletion area and will be reabsorbed before registering a charge in the pixel. The electron is lost due to the high probability of recombination before the electron drifts through the photodiode.

In the modified pixel 262, the UV photon 266 is also immediately converted to an electron 272 with almost no penetration. The electron is generated very close to the added thin layer 270 of doped silicon. The doped silicon layer generates a static electric field to repel the electron down into the photodiode. The electron is swept away toward the depletion area and is more likely to be registered as a charge.

While not necessary, there are benefits of selectively applying the thin layer process only to pixels that are used for detecting UV light. The electric field generated by the layer will uniformly affect any free electrons. This includes those generated from UV absorption and those generated thermally. The thermal electrons are typically considered to be noise and are referred to as dark current because they are generated without any impinging light. The dark current is generated all through the n-well of the pixel but it is the strongest at the surface. An electric field with an intensity to drive electrons at the surface toward the depletion area will also drive many thermally generated electrons that are at the surface. As a result, applying the electric field will increase the measured pixel dark current by driving many of these electrons into the depletion region. A secondary benefit to applying the thin layer process only to UV pixels is that UV photons need not be optically filtered from the visible and NIR pixels. In addition the optical crosstalk from UV photons registering with these pixels is reduced.

Figure 6:
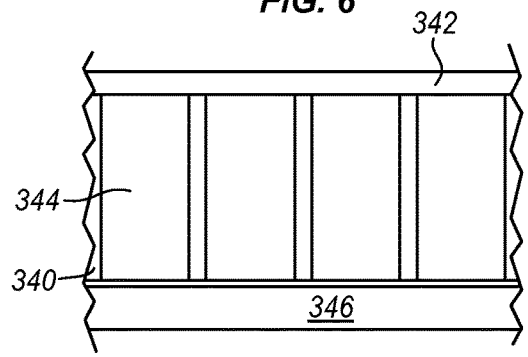
FIG. 6 is a cross-sectional side view diagram of a portion of an image sensor array with uniform pixels according to an embodiment.

FIGS. 6-9 are cross-sectional side view diagrams of a portion of an image array to show a process for forming the δ-doped silicon layer over a photodetector array such as that shown in FIG. 4. FIG. 6 has a p-epi layer 340 with formed photodetector n-wells 344. This layer was formed in a donor wafer that has been bonded to the substrate 346 and then the backside has been ground to expose the p-epi layer. Wiring layers and other electrical components are formed between the p-epi layer 340 and the mechanical substrate 346 as is typical for backside illuminated sensors. The wafer 346 may be solely mechanical or it may include additional circuitry as is common in stacked sensors.

A hard mask 342 of e.g. $Si_3N_4$ or $SiO_2$ is formed or deposited over each of the photodetectors. Instead of a hard mask, any other protective covering or material may be used that has a low diffusivity of sulfur. The mask 342 may be deposited or applied in any of a variety of different ways including PECVD (Plasma Enhanced Chemical Vapor Deposition) or ALD (Atomic Layer Deposition). A safe temperature for silicon may be used, such as below 500° C.

In this example, the hard mask is directly on top of the pixels. Four pixels are shown to indicate red, green, blue and UV subpixels. The pattern and arrangement may be different from that shown and a typical array will have millions of sub-pixels, although the invention is not so limited.

Figure 7:
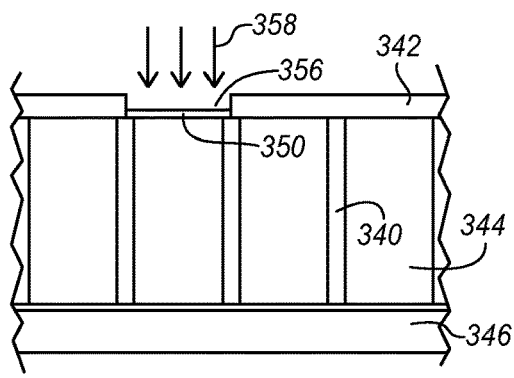
FIG. 7 is a cross-sectional side view diagram of a portion of the image sensor array of FIG. 6 with a hard mask opened for selective pixel enhancement according to an embodiment.

FIG. 7 is a similar cross-sectional side view of the same portion of the substrate 340 and hard mask 342. At this stage, the mask is etched away over the UV pixel to form an opening 356. The mask may be etched in any of a variety of different ways, for example, a sub micrometer scale lithography technology or method may be used to selectively etch away the mask layer from over the UV subpixel area. As shown the visible light pixels 344 are not affected. The mask is only removed over the UV pixels.

There are several techniques that may be used to add an electric potential to the surface of the UV detector. A δ-doped approach is able to support a relatively large connected electric potential and may be placed close to the surface of the detector. Layers may also be formed by molecular beam epitaxy, ultrashallow implant, and a more conventional ion implant. A layer closer to the surface of the detector improves the effectiveness of the applied charge because any electrons generated by UV will be very close to the surface. If the layer is too far from the surface, then the UV photons may be absorbed before the added layer and will be blocked from reaching the photo-diode's depletion region and lost to recombination.

In applying 358 the δ-doped layer 350, steps may be taken to keep the native oxide thickness to below 1 nm. With a thin oxide and a p-type δ-doped layer of about 3 nm, there is a high probability that NUV photons will be absorbed behind this layer and consequently swept to the depletion region. Such a thin layer may be formed in a variety of different ways.

As mentioned, a silicon mask e.g. $Si_3N_4$ mask, is applied and openings are made over the UV sub pixel active areas 356. This may be done using appropriate lithography and etch methods or using other techniques.

With the openings made, the active areas may be cleaned. The active areas are primarily the n-wells in the epitaxial layer. A variety of appropriate acid bath and acid solutions may be applied to remove impurities and to thin the oxide. A deionized water or other rinse may be applied after the acid washes.

The p-type δ-doped silicon layer 350 is then applied 358. As mentioned, this enables a high internal quantum efficiency (QE) for UV light and especially NUV light. In one example, a layer of less than 0.6 nm of p-type Germanium (e.g. $GeH_4$) is followed by layer of less than 0.6 nm p-type Silicon (e.g. $Si_2H_6$ or $Si_3H_8$). The layers are applied to form a repeated heterostructure stack with 2 or 3 repetitions. Any of a variety of different p-type dopants may be used, including boron. A p-type dopant is used over the n-well. Alternatively in a p-well photodetector structure, an n-type dopant may be used instead.

In another embodiment a layer of less than 3 nm of a p-type $Si_xGe_1-x$ stack is grown over the n-well. Precursors such as $GeH_4$ and $Si_2H_6$ may be used to enhance the epitaxial growth.

In another embodiment a layer of less than 3 nm of p-type silicon is grown using $Si_2H_6$ or $Si_3H_8$ as precursors. Selective Reduced Pressure Chemical Vapor Deposition (RP-CVD) may be used for all of the examples above. Alternatively, MBE, MOCVD, or other technologies may be used, depending on the particular implementation. The resulting conductive layer will then accumulate a thin native oxide over the δ-doped layer. The native oxide helps to isolate the electric potential on the δ-doped layer.

Figure 8:
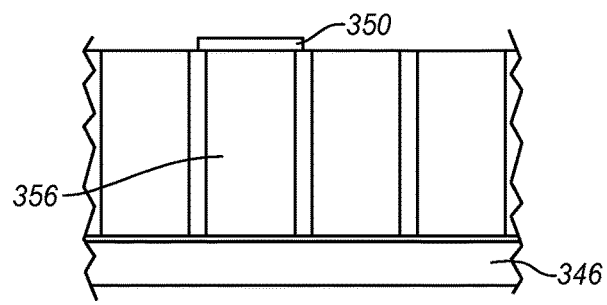
FIG. 8 is a cross-sectional side view diagram of a portion of the image sensor array of FIG. 7 with the hard mask removed according to an embodiment.

FIG. 8 is a similar cross-sectional side view of the same portion of the image sensor array after the mask has been removed. The mask may be removed using an appropriate wet or dry etching method, depending on the nature of the mask. As a result, the δ-layer is only in the UV pixel and the other pixels are not changed through this selective process of treating only the UV pixels.

Figure 9:
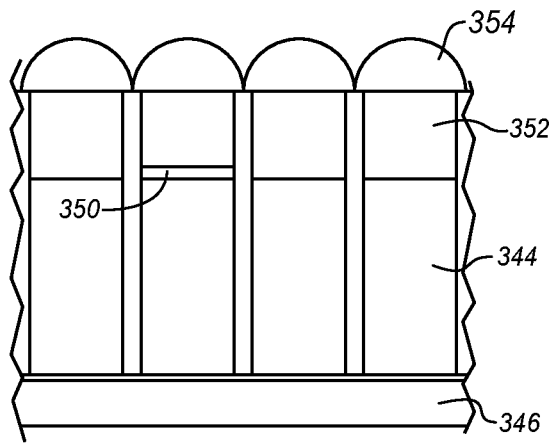
FIG. 9 is a cross-sectional side view diagram of a portion of the image sensor array of FIG. 8 with selective pixel enhancement after finishing according to an embodiment.

FIG. 9 is a similar cross-sectional side view of the same array. The processing is continued to finish the image sensors including depositing color filters 352, forming micro lenses 354, applying coatings, barriers, diffusions, etc. In operation, an electric potential is generated by the δ-doped layer.

Figure 10:
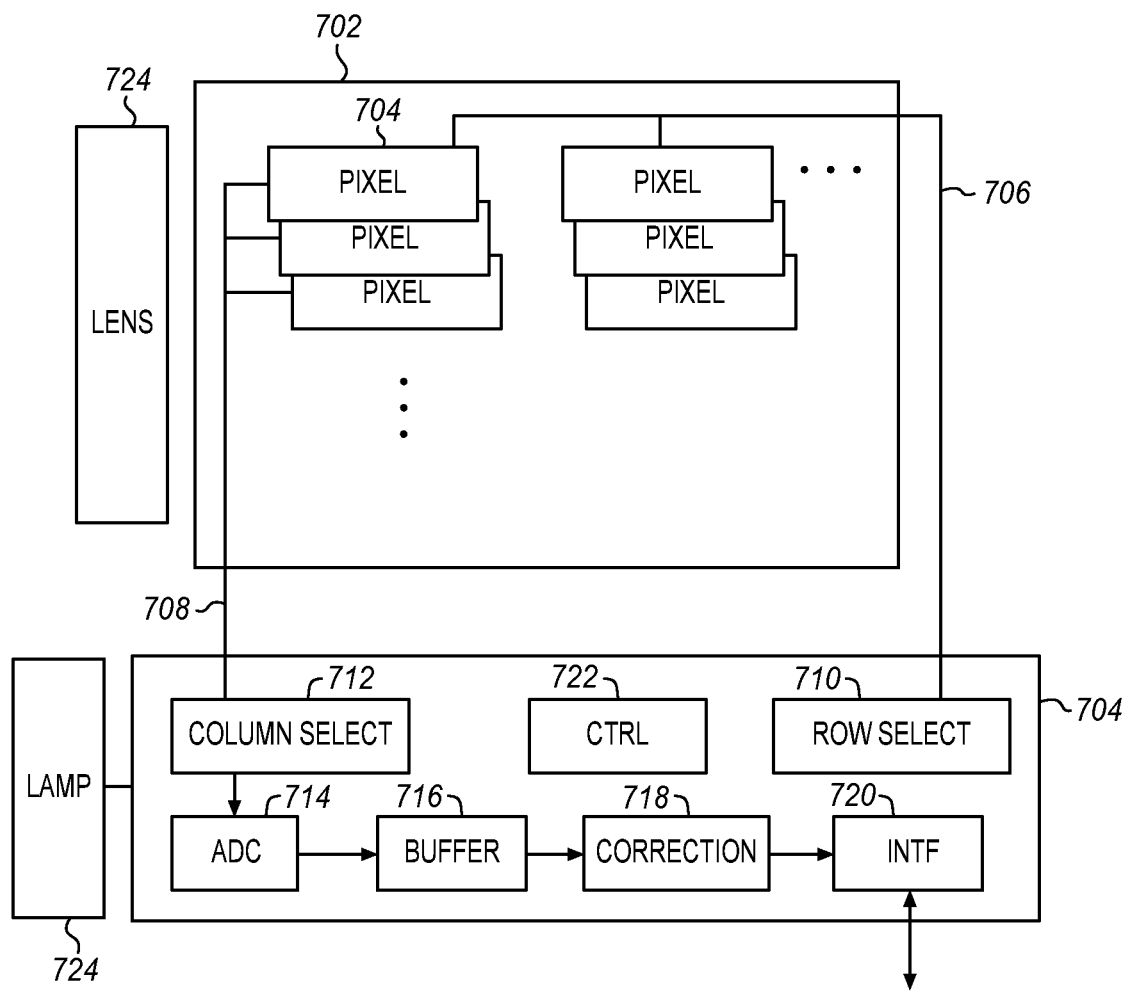
FIG. 10 is a block diagram of an image sensor with multiple photodetectors and hyperspectral depth imaging according to an embodiment.

FIG. 10 is a block diagram of an image sensor or camera system 700 that may include pixel circuits with infrared light enhancement properties as described herein. The camera 700 includes an image sensor 702 with pixels typically arranged in rows and columns. Each pixel may have a micro-lens and tuned photodetectors as described above. Each pixel is coupled to a row line 706 and a column line 708. These are applied to the image processor 704.

The image processor has a row selector 710 and a column selector 712. The voltage on the column line is fed to an ADC (Analog to Digital Converter) 714 which may include sample and hold circuits and other types of buffers. Alternatively, multiple ADC's may be connected to column lines in any ratio optimizing ADC speed and die area. The ADC values are fed to a buffer 716, which holds the values for each exposure to apply to a correction processor 718. This processor may compensate for any artifacts or design constraints of the image sensor or any other aspect of the system. The complete image is then compiled and rendered and may be sent to an interface 720 for transfer to external components.

The image processor 704 may be regulated by a controller 722 and contain many other sensors and components. It may perform many more operations than those mentioned or another processor may be coupled to the camera or to multiple cameras for additional processing. The controller may also be coupled to a lens system 724. The lens system serves to focus a scene onto the sensor and the controller may adjust focus distance, focal length, aperture and any other settings of the lens system, depending on the particular implementation. For stereo depth imaging, a second lens 724 and image sensor 702 may be used. This may be coupled to the same image processor 704 or to its own second image processor depending on the particular implementation.

The controller may also be coupled to a lamp or projector 724. This may be an LED in the visible or infrared range, a Xenon flash, or another illumination source, depending on the particular application for which the lamp is being used. The controller coordinates the lamp with the exposure times to achieve different exposure levels described above and for other purposes. The lamp may produce a structured, coded, or plain illumination field. There may be multiple lamps to produce different illuminations in different fields of view.

Figure 11:
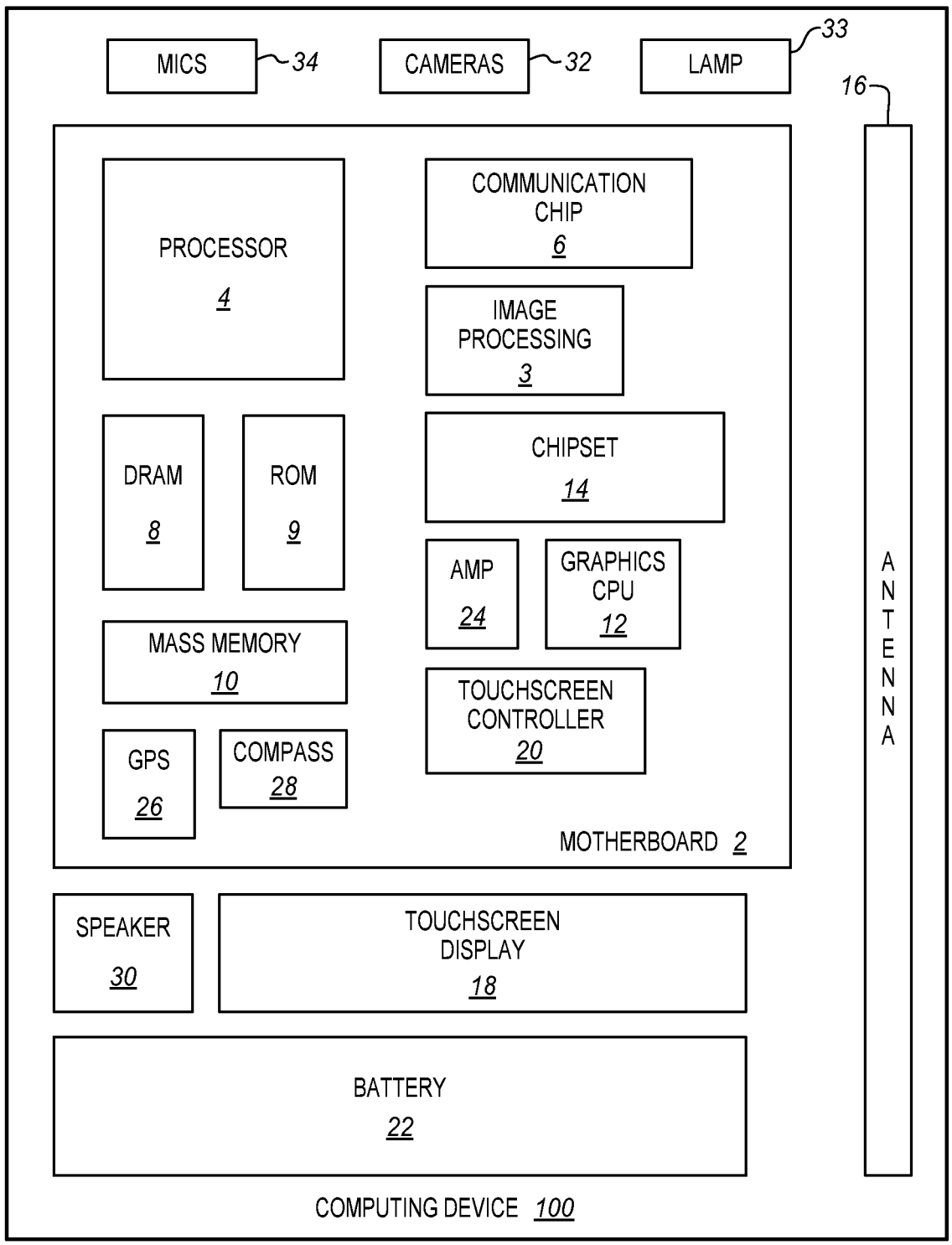
FIG. 11 is a block diagram of a computing device incorporating hyperspectral imaging or UV sensing according to an embodiment.

FIG. 11 is a block diagram of a computing device 100 in accordance with one implementation. The computing device 100 houses a system board 2. The board 2 may include a number of components, including but not limited to a processor 4 and at least one communication package 6. The communication package is coupled to one or more antennas 16. The processor 4 is physically and electrically coupled to the board 2.

Depending on its applications, computing device 100 may include other components that may or may not be physically and electrically coupled to the board 2. These other components include, but are not limited to, volatile memory (e.g., DRAM) 8, non-volatile memory (e.g., ROM) 9, flash memory (not shown), a graphics processor 12, a digital signal processor (not shown), a crypto processor (not shown), a chipset 14, an antenna 16, a display 18 such as a touchscreen display, a touchscreen controller 20, a battery 22, an audio codec (not shown), a video codec (not shown), a power amplifier 24, a global positioning system (GPS) device 26, a compass 28, an accelerometer (not shown), a gyroscope (not shown), a speaker 30, a camera 32, a lamp 33, a microphone array 34, and a mass storage device (such as a hard disk drive) 10, compact disk (CD) (not shown), digital versatile disk (DVD) (not shown), and so forth). These components may be connected to the system board 2, mounted to the system board, or combined with any of the other components.

The communication package 6 enables wireless and/or wired communications for the transfer of data to and from the computing device 100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication package 6 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 100 may include a plurality of communication packages 6. For instance, a first communication package 6 may be dedicated to shorter range wireless communications such as Wi-Fi and Bluetooth and a second communication package 6 may be dedicated to longer range wireless communications such as GPS, EDGE, GPRS, CDMA, WiMAX, LTE, Ev-DO, and others.

The cameras 32 contain image sensors with pixels or photodetectors as described herein. The image sensors may use the resources of an image processing chip 3 to read values and also to perform exposure control, depth map determination, format conversion, coding and decoding, noise reduction and 3D mapping, etc. The processor 4 is coupled to the image processing chip to drive the processes, set parameters, etc.

In various implementations, the computing device 100 may be eyewear, a laptop, a netbook, a notebook, an ultrabook, a smartphone, a tablet, a personal digital assistant (PDA), an ultra mobile PC, a mobile phone, a desktop computer, a server, a set-top box, an entertainment control unit, a digital camera, a portable music player, a digital video recorder, wearables or drones. The computing device may be fixed, portable, or wearable. In further implementations, the computing device 100 may be any other electronic device that processes data.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to a method of forming an image sensor that includes forming an array of photodetectors on a silicon substrate, treating a subset of the photodetectors to improve sensitivity to ultraviolet light, and finishing the photodetector array to form an image sensor.

In further embodiments forming an array comprises forming an array on the back side of the substrate after forming circuitry on the front side of the substrate.

In further embodiments treating comprises applying a thin conductive layer to the subset of the photodetectors to carry an electric charge.

In further embodiments applying comprises forming a mask over the photodetectors that are not of the subset and applying a doped semiconductor over the photodetectors that are not masked.

In further embodiments the doped semiconductor is a p-type silicon, the applying further comprising using silicon-based precursors prior to applying the p-type silicon.

In further embodiments applying comprises depositing doped silicon using metal organic chemical vapor deposition on the subset of the photodetectors.

In further embodiments applying comprises depositing alternating layers of p-type germanium and p-type silicon on the subset of photodetectors.

In further embodiments treating comprises depositing a δ-doped layer of p-type silicon using reduced pressure chemical vapor deposition.

In further embodiments the treating comprises applying a thin conductive layer that generates a static electrical charge over an n-well of the subset of the photodetectors.

In further embodiments the electrical charge is configure to generate an electric field that sweeps electrons generated near a surface of the photodetector to a depletion zone for collection.

Further embodiments include applying a red, a green, or a blue color light filter in a repeating pattern over each photodetector that is not treated.

Some embodiments pertain to an image sensor that includes a silicon substrate, a first set of photodetectors on the silicon substrate that have a thin layer over an active area to improve sensitivity to ultraviolet light, a second set of photodetectors on the silicon substrate, that do not have the thin layer, and an optical system to direct visible and infrared light to the first and the second sets of photodetectors.

In further embodiments the thin layer comprises a doped semiconductor layer.

In further embodiments the thin layer has a thickness of less than 3 nm.

In further embodiments the array is formed on a back side of the silicon substrate.

Further embodiments include circuit layers on a front side of the silicon substrate opposite the optical system.

Some embodiments pertain to a portable computing system that includes a processor, a communications chip coupled to the processor to send and receive images, and an image sensor coupled to the processor having a silicon substrate, a first set of photodetectors on the silicon substrate that have a thin layer over an active area to improve sensitivity to ultraviolet light, a second set of photodetectors on the silicon substrate, that do not have the thin layer, and an optical system to direct visible and infrared light to the first and the second sets of photodetectors.

In further embodiments the first set of photodetectors has a thin conductive layer that generates a static electrical charge over an n-well of the subset of the photodetectors.

In further embodiments the first set of photodetectors has a δ-doped layer of p-type silicon over an n-well of the subset of photodetectors.

In further embodiments the first set of photodetectors is distributed across the sensor in a repeating pattern with the second set of photodetectors.

What is claimed is:

1. An image sensor comprising:
    a silicon substrate;
    a first set of photodetectors on the silicon substrate that have a thin layer that is conductive and is disposed over an active area and that generates a static electrical charge over an n-well of the first set of photodetectors to detect ultra-violet light;
    a second set of photodetectors on the silicon substrate that do not have the thin layer to detect light that is other than ultra-violet light; and
    an optical system to direct visible and infrared light to the first and the second sets of photodetectors.

2. The image sensor of claim 1, wherein the thin layer comprises a doped semiconductor layer.

3. The image sensor of claim 1, wherein the thin layer has a thickness of less than 3 nm.

4. The image sensor of claim 1, wherein the first and second sets of photodetectors form an array that is formed on a back side of the silicon substrate.

5. The image sensor of claim 4, further comprising circuit layers on a front side of the silicon substrate opposite the optical system.

6. A portable computing system comprising:
    a processor;
    a communications chip coupled to the processor to send and receive images; and
    an image sensor coupled to the processor having a silicon substrate, a first set of photodetectors on the silicon substrate that have a thin layer that is conductive and is disposed over an active area that generates a static electrical charge over an n-well of the first set of the photodetectors to detect ultra-violet light, a second set of photodetectors on the silicon substrate that do not have the thin layer to detect light other than ultra-violet light, and an optical system to direct visible and infrared light to the first and the second sets of photodetectors.

7. The system of claim 6, wherein the first set of photodetectors has a δ-doped layer of p-type silicon over an n-well of the subset of photodetectors.

8. The system of claim 6, wherein the first set of photodetectors is distributed across the sensor in a repeating pattern with the second set of photodetectors.

9. A camera comprising:
    an image sensor array comprising:
        a silicon substrate,
        a first set of photodetectors on the silicon substrate that have a thin layer that is conductive and is disposed over an active area and that generates a static electrical charge over an n-well of the first set of photodetectors to detect ultra-violet light,
        a second set of photodetectors on the silicon substrate that do not have the thin layer to detect other than ultra-violet light, and
        an optical system to direct visible and infrared light to the first and the second sets of photodetectors.

10. The camera of claim 9, wherein the thin layer comprises a doped semiconductor layer.

11. The camera of claim 9, wherein the thin layer has a thickness of less than 3 nm.

12. The camera of claim 9, wherein the array is formed on a back side of the silicon substrate.

13. The camera of claim 12, further comprising circuit layers on a front side of the silicon substrate opposite the optical system.

14. The camera of claim 9, wherein the first set of photodetectors has a δ-doped layer of p-type silicon over an n-well of the subset of photodetectors.

15. The camera of claim 9, wherein the first set of photodetectors is distributed across the array in a repeating pattern with the second set of photodetectors.

16. An image sensor comprising:
    a silicon substrate;
    a first set of photodetectors on the silicon substrate that have a thin layer that is conductive and is disposed over an active area and that generates an electric field arranged to move electrons toward a depletion layer on the photodetectors to detect ultra-violet light;
    a second set of photodetectors with n-wells on the silicon substrate that do not have the thin layer to detect light other than ultra-violet light;
    an optical system to direct visible and infrared light to the first and the second sets of photodetectors.

17. The image sensor of claim 16 wherein the electric field forms a static electrical charge.

18. The image sensor of claim 16 wherein the thin layer is disposed over an n-well on the photodetectors, and the depletion layer forms a bottom of the n-well.

19. The image sensor of claim 1 wherein the second set of photodetectors on the silicon substrate each have an n-well.

20. The system of claim 6 wherein the second set of photodetectors on the silicon substrate each have an n-well.

21. The camera of claim 9 wherein the second set of photodetectors on the silicon substrate each have an n-well.

22. The image sensor of claim 1 wherein the second set of photodetectors detects red, green, blue, or infra-red (IR) light.

23. The system of claim 6 wherein the second set of photodetectors detects red, green, blue, or infra-red (IR) light.

24. The camera of claim 9 wherein the second set of photodetectors detects red, green, blue, or infra-red (IR) light.

25. The image sensor of claim 16 wherein the second set of photodetectors detects red, green, blue, or infra-red (IR) light.

* * * * *